US005546015A

United States Patent [19]
Okabe

[11] Patent Number: 5,546,015
[45] Date of Patent: Aug. 13, 1996

[54] DETERMINING DEVICE AND A METHOD FOR DETERMINING A FAILURE IN A MOTOR COMPRESSOR SYSTEM

[76] Inventor: Toyohiko Okabe, 36-2 Nagae, Hayama-cho, Miura-gun, Kanagawa 240-01, Japan

[21] Appl. No.: 326,516

[22] Filed: Oct. 20, 1994

[51] Int. Cl.$^6$ .................................................. G01R 31/34
[52] U.S. Cl. .......................................... 324/772; 340/648
[58] Field of Search ........................... 324/772; 340/648, 340/664, 518, 521; 73/168

[56] References Cited

U.S. PATENT DOCUMENTS

| | | | |
|---|---|---|---|
| 3,934,239 | 1/1976 | Mason et al. | 340/648 |
| 4,514,724 | 4/1985 | Valentine | 340/648 |

FOREIGN PATENT DOCUMENTS

| | | |
|---|---|---|
| 397350 | 10/1991 | Japan . |
| 512996 | 2/1993 | Japan . |

Primary Examiner—Ernest F. Karlsen
Assistant Examiner—Russell M. Kobert
Attorney, Agent, or Firm—Oblon, Spivak, McClelland, Maier & Neustadt, P.C.

[57] ABSTRACT

A determining device for determining a failure in a motor compressor system, comprising a current detecting sensor for detecting a current input to a motor for driving a compressor, a mass flow sensor for detecting mass flow of compressible fluid sucked into the compressor, a compression ratio detecting sensor for detecting a compression ratio of the compressor, a reference value generating unit for generating a limit reference value for determining whether or not a failure in the motor compressor system has occurred by comparing the current detected by the current detecting sensor with the limit reference value, and a failure determining unit for determining that a failure in the motor compressor system has occurred when the current is beyond the limit reference value. The limit reference value is increased in accordance with an increase of the mass flow or an increase of the compression ratio.

17 Claims, 7 Drawing Sheets

5,546,015

DETERMINING DEVICE AND A METHOD FOR DETERMINING A FAILURE IN A MOTOR COMPRESSOR SYSTEM

BACKGROUND OF THE INVENTION

1. Field of the Invention

The present invention relates to an apparatus and a method for determining a failure in a motor compressor system.

2. Description of Related Art

When a failure occurs in a part of a motor compressor system, for example, a compressor or a motor for driving the compressor, a current input to the motor changes. Therefore, it can be determined whether or not a failure in the motor compressor system has occurred by detecting the current and comparing the detected current with a predetermined limit reference current. In the case of a motor for driving a compressor, however, the current input to the motor changes significantly even though a failure does not occur, because compression work of the compressor will change in accordance with operating conditions.

Accordingly, when the limit reference current is fixed at a predetermined constant value, a problem arises in that there may be an indication that a failure has occurred, even though there actually has been no failure in the motor compressor system, if the limit reference current value is too low. On the other hand, where the limit reference current value is too high, there may be no indication that a failure has occurred, even though there has been a failure in the motor compressor system.

In order to solve this problem, in Japanese Utility Model Publication No. 3-97350, the present inventor disclosed a device for determining a failure in a motor compressor utilized for a refrigeration circuit. In this device, the limit reference current is changed on the basis of a discharge pressure of the compressor, a suction pressure of the compressor, a discharge temperature, or an evaporative temperature.

However, the current input to the motor for driving a compressor is increased in accordance with an increase of compression work of the compressor. In fact, actual compression work is increased in accordance with an increase of mass flow or an increase of compression ratio.

Therefore, in the determining device disclosed in Japanese Utility Model Publication No. 3-97350, a problem arises in that an accurate failure determination still can not be executed over the wide operation range of the compressor.

SUMMARY OF THE INVENTION

An object of the present invention is to provide an apparatus and a method capable of accurately determining a failure in a motor compressor system over a wide operation range of a compressor.

Therefore, according to the present invention, there is provided a determining device for determining a failure in a motor compressor system, comprising: a current detector for detecting a current input to a motor for driving a compressor; a mass flow detector for detecting the mass flow of compressible fluid sucked into the compressor; a compression ratio detector for detecting a compression ratio of the compressor; a reference value generator for generating a limit reference value for determining whether or not a failure in the motor compressor system has occurred by comparing the current detected by the current detector with the limit reference value, the limit reference value being increased in accordance with an increase of the mass flow detected by the mass flow detector or an increase of the compression ratio detected by the compression ratio detector; and a failure determining unit for determining that a failure in the motor compressor system has occurred when the current is beyond the limit reference value.

Further, according to the present invention, there is provided a method for determining a failure in a motor compressor system, comprising the steps of: detecting a current input to a motor for driving a compressor; detecting mass flow of compressible fluid sucked into the compressor; detecting a compression ratio of the compressor; generating a limit reference value for determining whether or not a failure in the motor compressor system has occurred by comparing the current with the limit reference value, the limit reference value being increased in accordance with an increase of the mass flow or an increase of the compression ratio; and determining that a failure in the motor compressor system has occurred when the current is beyond the limit reference value.

The present invention may be more fully understood from the description of preferred embodiments of the invention set forth below, together with the accompanying drawings.

DESCRIPTION OF THE PREFERRED EMBODIMENTS

Referring to FIG. 1 through FIG. 7, a first embodiment of the present invention is described.

Figure 1:
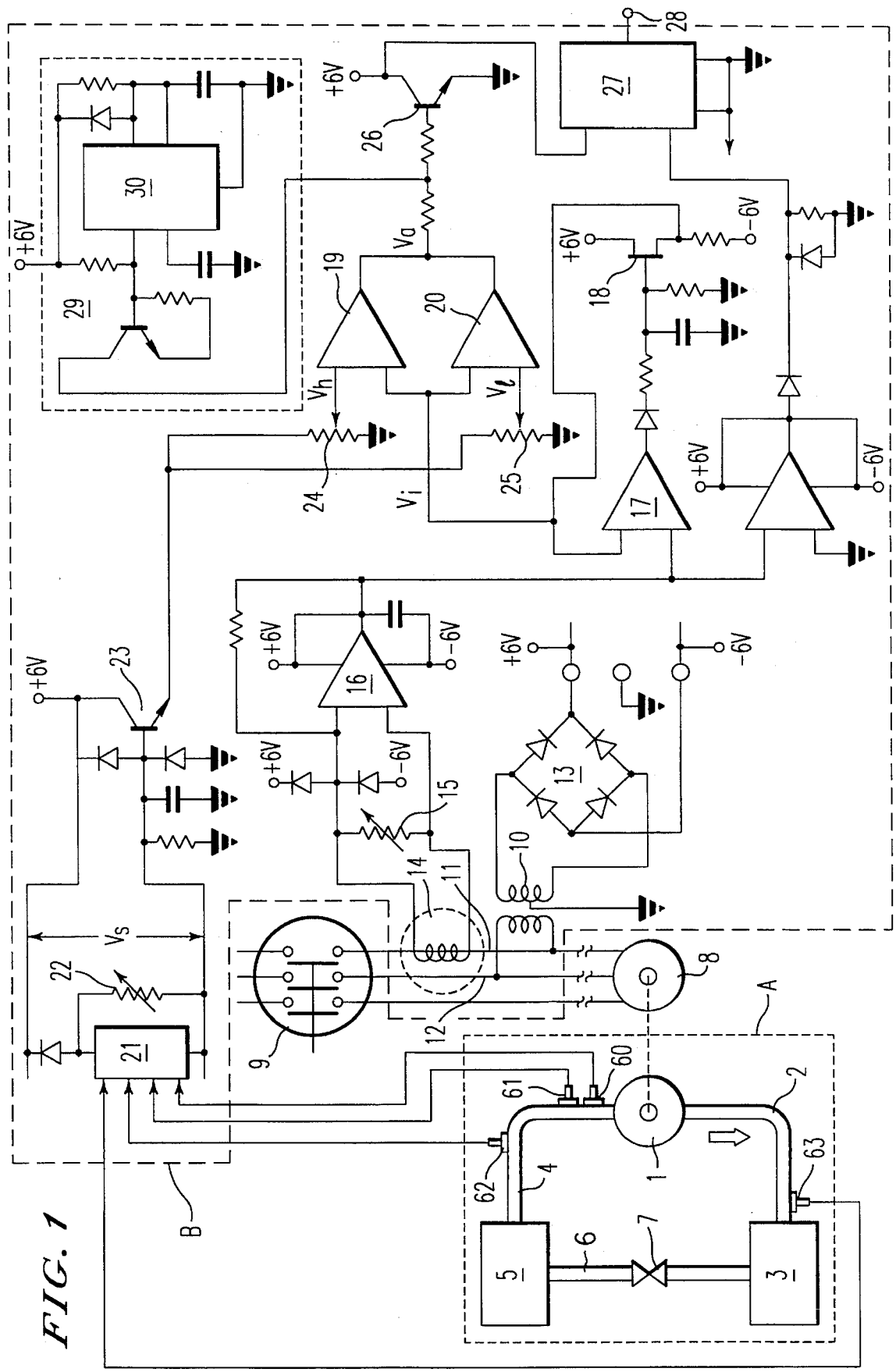
FIG. 1 is a schematic view of the first embodiment of a failure determining device according to the present invention.

Referring to FIG. 1, there is illustrated a refrigeration circuit A and a failure determining device B. In the refrigeration circuit A, a reciprocating compressor 1 is connected to a condenser 3 via a discharge pipe 2 and to an evaporator 5 via a suction pipe 4. The condenser 3 and the evaporator 5 are connected via a pipe 6 and an expansion valve 7 is provided in the pipe 6. Compressible fluid discharged from the compressor 1 flows into the condenser 3 and is liquefied therein. After passing through the expansion valve 7, the compressible fluid is evaporated at the evaporator 5 and then sucked into the compressor 1. A motor 8 for driving the compressor 1 is a three-phase induction motor and is connected to a power source via a switch 9.

In the failure determining device B, a transformer 10 is connected to lead wires 11 and 12 which connects the motor 8 and the switch 9. Electric power is supplied to the failure determining device B by the transformer 10 and a rectifier circuit 13 connected to the transformer 10 and power supply.

A current transformer 14 for detecting a current I input to the motor 8 is attached to the lead wire 11. The current transformer 14 is easily attached to the lead wire 11 by clamping. The output terminal of the current transformer 14 is connected to a variable resistor 15 and, thus, voltage proportional to the current I is generated at the variable resistor 15. This voltage is input to an operational amplifier 16 and amplified. An output from the operational amplifier 16 is input to an operational amplifier 17 and the base of a transistor 18 for further amplification. The voltage Vi output from the operational amplifier 17 and the transistor 18 represents input current I and is input to a window operational amplifier comprising operational amplifiers 19 and 20. At the window operational amplifier, the voltage Vi is compared with upper limit reference voltage Vh and lower limit reference voltage Vl respectively.

Figure 2:
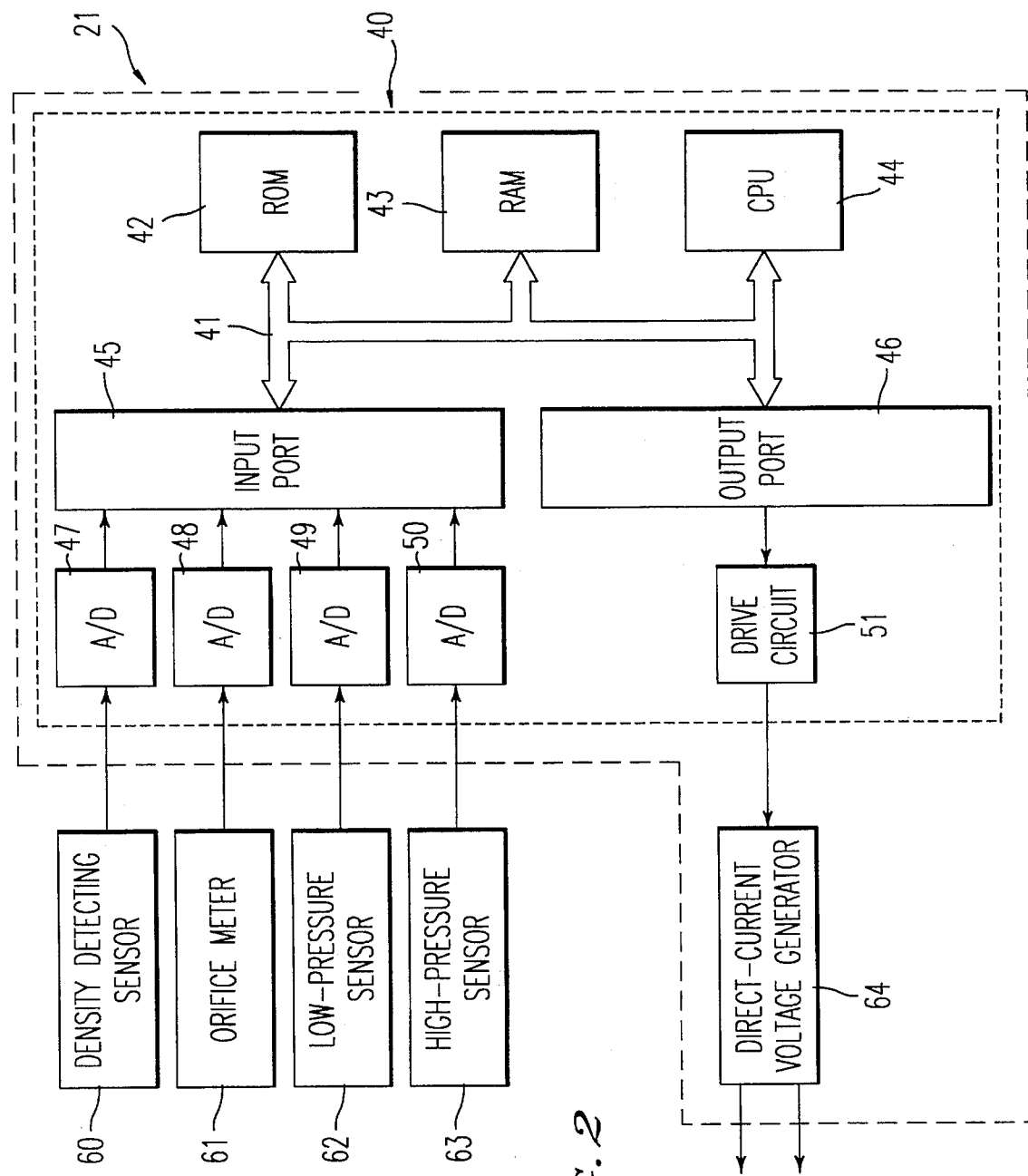
FIG. 2 is a block diagram of a device for generating a reference voltage.

A device 21 for generating a reference voltage comprises an electronic control unit 40 shown in FIG. 2. Referring to FIG. 2, the electronic control unit 40 is constructed as a digital computer and comprises a ROM (read only memory) 42, a RAM (random access memory) 43, a CPU (microprocessor) 44, an input port 45, and an output port 46. The ROM 42, the RAM 43, the CPU 44, the input port 45, and the output port 46 are interconnected via a bidirectional bus 41.

Referring to FIG. 1 and FIG. 2, a density detecting sensor 60 for detecting the density of compressible fluid sucked into the compressor 1 is arranged at the suction pipe 4 in the vicinity of the compressor 1, and the density detecting sensor 60 is connected to the input port 45 via an A/D converter 47. An orifice meter 61 for detecting volumetric flow of compressible fluid sucked into the compressor 1 is arranged at the suction pipe 4 close to the density detecting sensor 60, and the orifice meter 61 is connected to the input port 45 via an A/D converter 48. A low pressure sensor 62 for detecting a suction pressure of the compressor 1 is arranged at the suction pipe 4, and the low pressure sensor 62 is connected to the input port 45 via an A/D converter 49. A high pressure sensor 63 for detecting a discharge pressure of the compressor 1 is arranged at the discharge pipe 2, and the high pressure sensor 63 is connected to the input port 45 via an A/D converter 50.

The output port 46 is connected to a direct-current voltage generator 64 via a drive circuit 51.

Figure 3:
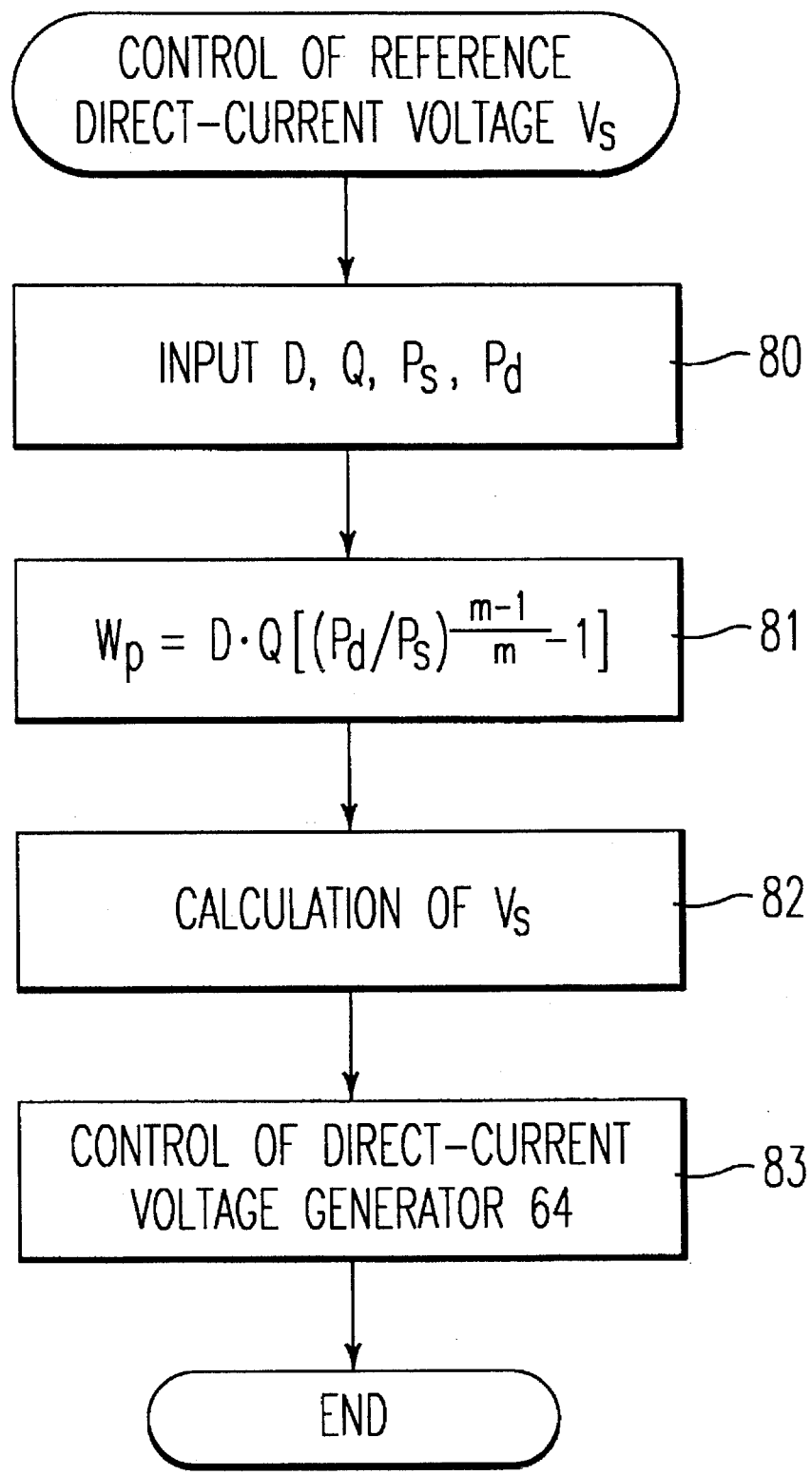
FIG. 3 is a flow chart for controlling the reference direct-current voltage Vs.

FIG. 3 illustrates a routine for controlling reference direct-current voltage Vs generated by the direct-current voltage generator 64. This routine is processed by sequential interruptions executed at predetermined intervals.

Referring to FIG. 3, at step 80, the density D of compressible fluid detected by the density detecting sensor 60, the volumetric flow Q of compressible fluid detected by the orifice meter 61, the suction pressure Ps detected by the low pressure sensor 62, and the discharge pressure Pd detected by the high pressure sensor 63 are input to the CPU 44. Then, at step 81, compression work Wp of the reciprocating compressor is calculated on the basis of the following equation.

$$Wp = D*Q[(Pd/Ps)^{\frac{m-1}{m}} - 1] \quad (1)$$

In this equation, D*Q shows mass flow, Pd/Ps shows a compression ratio, and m is a polytropic exponent.

In fact, since polytropic compression is executed in an actual reciprocating compressor, actual compression work can be calculated accurately from the equation (1). Accordingly, compression work is increased in accordance with an increase of mass flow or an increase of compression ratio.

Figure 4:
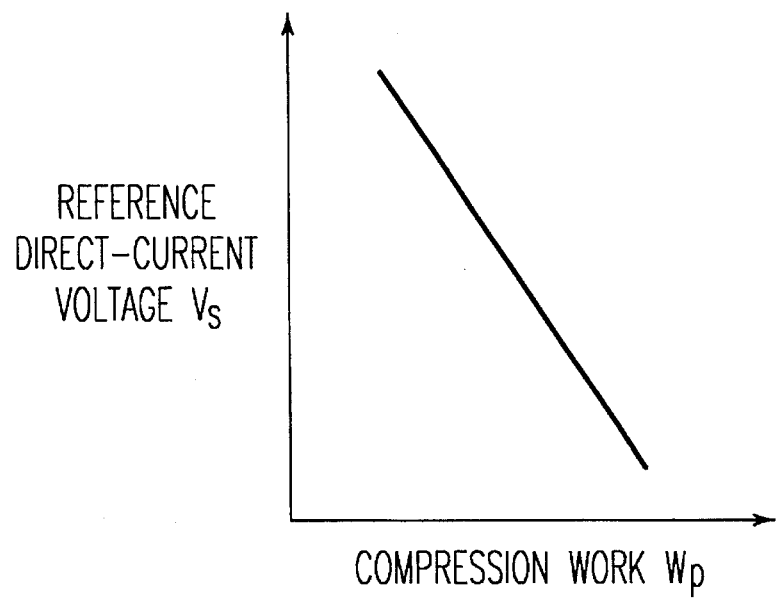
FIG. 4 illustrates the relationship between compression work Wp and the reference direct-current voltage Vs.
Figure 5:
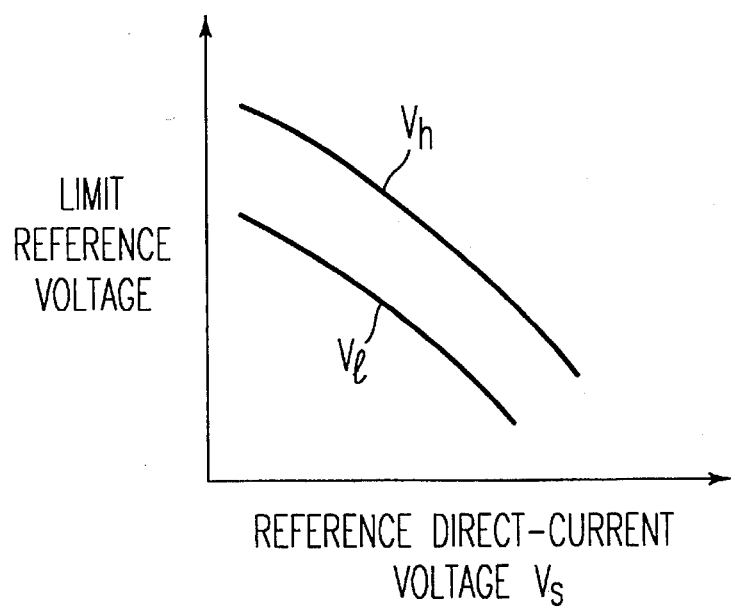
FIG. 5 illustrates the relationships between the reference direct-current voltage Vs and the upper and lower limit reference voltages Vh, Vl.

At step 82, the voltage Vs to be generated by the direct-current voltage generator 64 is calculated from the relationship shown in FIG. 4, on the basis of the compression work Wp. Referring to FIG. 4, the reference direct-current voltage Vs is linearly reduced in accordance with an increase of the compression work Wp. The relationship between the compression work Wp and the reference direct-current voltage Vs shown in FIG. 4 is memorized in ROM 42 as a map.

At step 83, the direct-current voltage generator 64 is controlled via the drive circuit 51 such that the reference direct-current voltage Vs generated by the direct-current voltage generator 64 becomes the voltage calculated at step 82, and then the routine is completed.

Referring again to FIG. 1, the reference direct-current voltage Vs generated by the device 21 can be slightly adjusted by a variable resistor 22. After the reference direct-current voltage Vs is amplified by a transistor 23, the voltage Vs is impressed on a variable resistor 24 for generating the upper limit reference voltage Vh and on a variable resistor 25 for generating the lower limit reference voltage Vl. The upper limit reference voltage Vh and the lower limit reference voltage Vl are reduced as the reference direct-current voltage Vs is increased, because the voltage between the base of the transistor 23 and earth is reduced as the reference direct-current voltage Vs is increased (see FIG. 5). The variable resister 24 is adjusted to supply the upper limit reference voltage Vh to the operational amplifier 19 and the variable resister 25 is adjusted to supply the lower limit reference voltage Vl to the operational amplifier 20.

Figure 6:
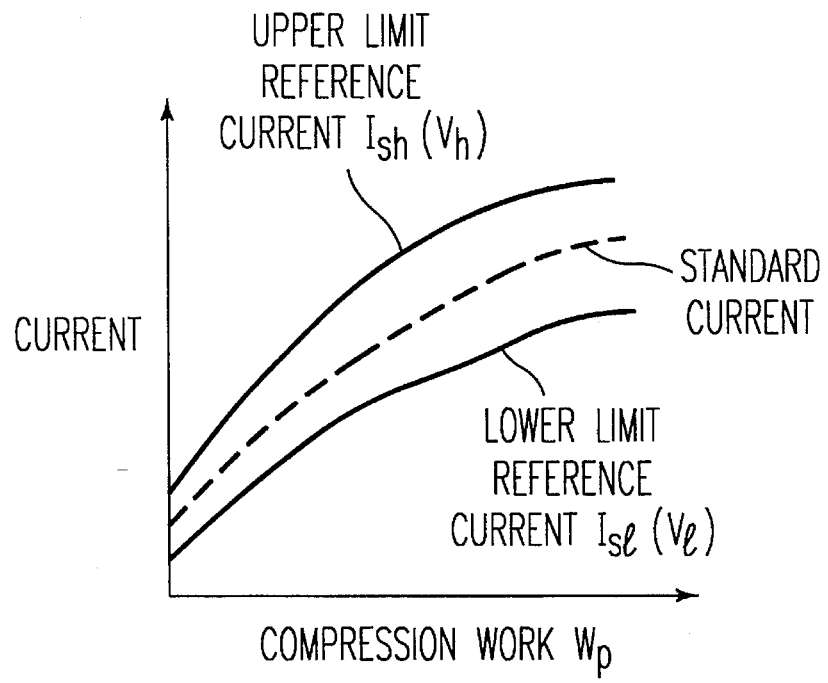
FIG. 6 illustrates the relationships between the compression work Wp and the upper and lower limit reference currents Ish, Isl.

Therefore, in the first embodiment, as shown in FIG. 6, the upper limit reference voltage Vh which represents an upper limit reference current Ish, and the lower limit reference voltage Vl which represents a lower limit reference current Isl, are increased in accordance with an increase of the compression work Wp, i.e., an increase of mass flow or an increase of compression ratio. The reason why the upper and lower limit reference voltages Vh and Vl are increased in this manner is that, a standard current Is, which is input to the motor when the motor compressor system is in a normal condition, is increased in accordance with an increase of compression work Wp.

A first ratio (r1=(Ish−Is)/Is) of the difference between the upper limit reference current Ish and a standard current Is input to the motor when the motor compressor system is in a normal condition to the standard current Is and a second ratio (r2=(Is−Isl)/Is) of the difference between the lower limit reference current Isl and the standard current Is to the standard current Is are constant regardless of the change of compression work Wp of the compressor. The first ratio r1 is equal to the second ratio r2. Since the upper and lower limit reference currents Ish and Isl (voltages Vh and Vl) are determined as described above, it can be determined more accurately whether or not a failure in the motor compressor system has occurred.

Figure 7:
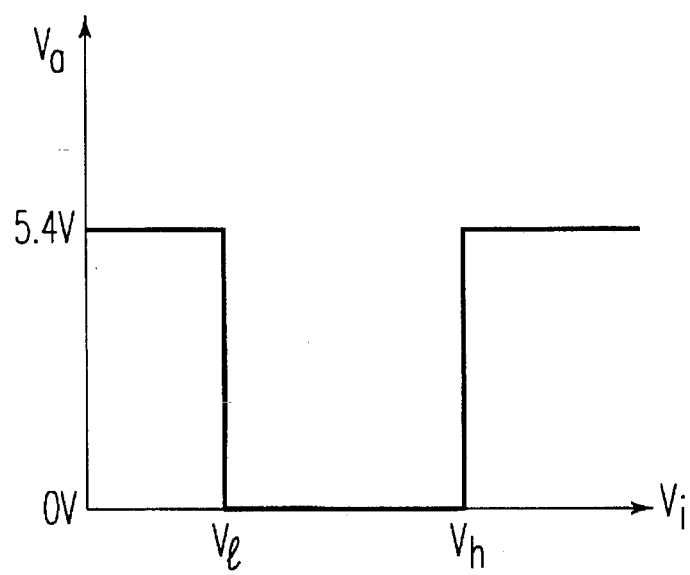
FIG. 7 illustrates the relationship between the voltage Vi showing current input to a motor and the voltage Va output from the window operational amplifier.

Referring to FIG. 7, voltage Va output from the window operational amplifier is a first predetermined value, for example, 5.4 V when the voltage Vi showing the current I input to the motor 8 is smaller than the lower limit reference voltage Vl, or larger than the upper limit reference voltage Vh. The voltage Va is a second predetermined value, for example, 0 V when the voltage Vi is between the lower limit reference voltage Vl and the upper limit reference voltage Vh.

An output terminal of the window operational amplifier is connected to an IC (integrated circuit) 27 for controlling an alarm 28, which can emit sound or light, via a transistor 26 acting as an amplifier. When the voltage Va output from the window operational amplifier is equal to the first predetermined value (5.4 V), the alarm is controlled to emit sound or light.

A timer unit 29 comprises a timer 30 for counting time from the time when power supply to the motor 8 was started. The timer unit 29 grounds the output terminal of the window operational amplifier in order to control the alarm 28 not to emit sound or light until a predetermined time, for example, 30 seconds, has elapsed from the time when a power supply to the motor 8 was started. Since starting current input to the motor 8 is very large, when the starting current is detected and the failure determination is executed on the basis of the detected starting current, it is erroneously determined that failure has occurred and the alarm is controlled to emit sound or light. With the timer feature, the alarm is prohibited from emitting sound or light until a predetermined time has elapsed from the time when a power supply to the motor 8 was started. Thus, an erroneous alarm can be prevented.

As described above, according to the first embodiment of the present invention, since the upper and lower limit reference voltages are increased in accordance with an increase of mass flow or an increase of compressive ratio, i.e., an increase of compressive work, it can be determined accurately whether or not a failure in the motor compressor system has occurred over a wide operation range of the reciprocating compressor, even though the load of the compressor changes significantly.

Figure 8:
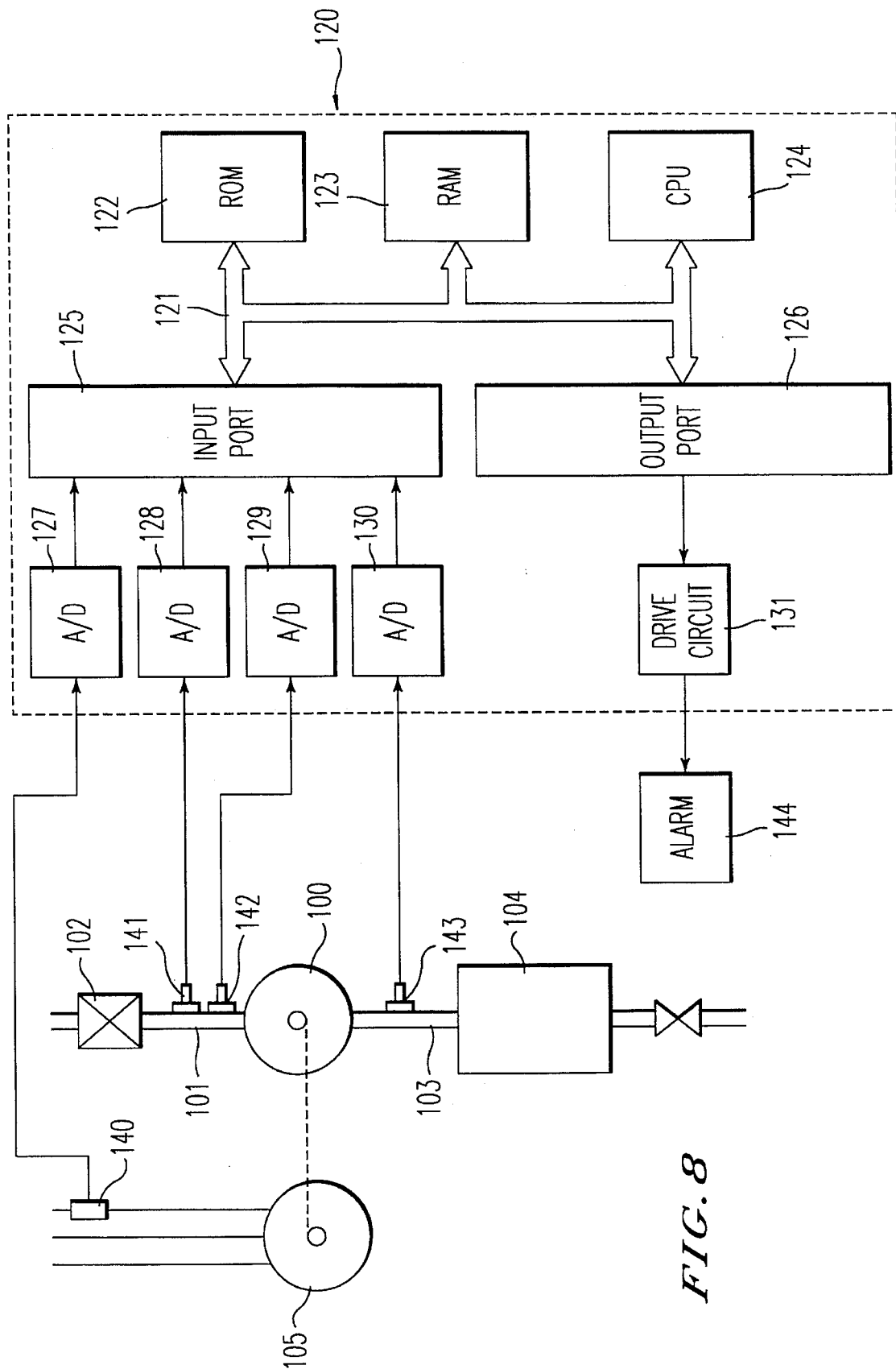
FIG. 8 is a schematic view of the second embodiment of a failure determining device according to the present invention.
Figure 9:
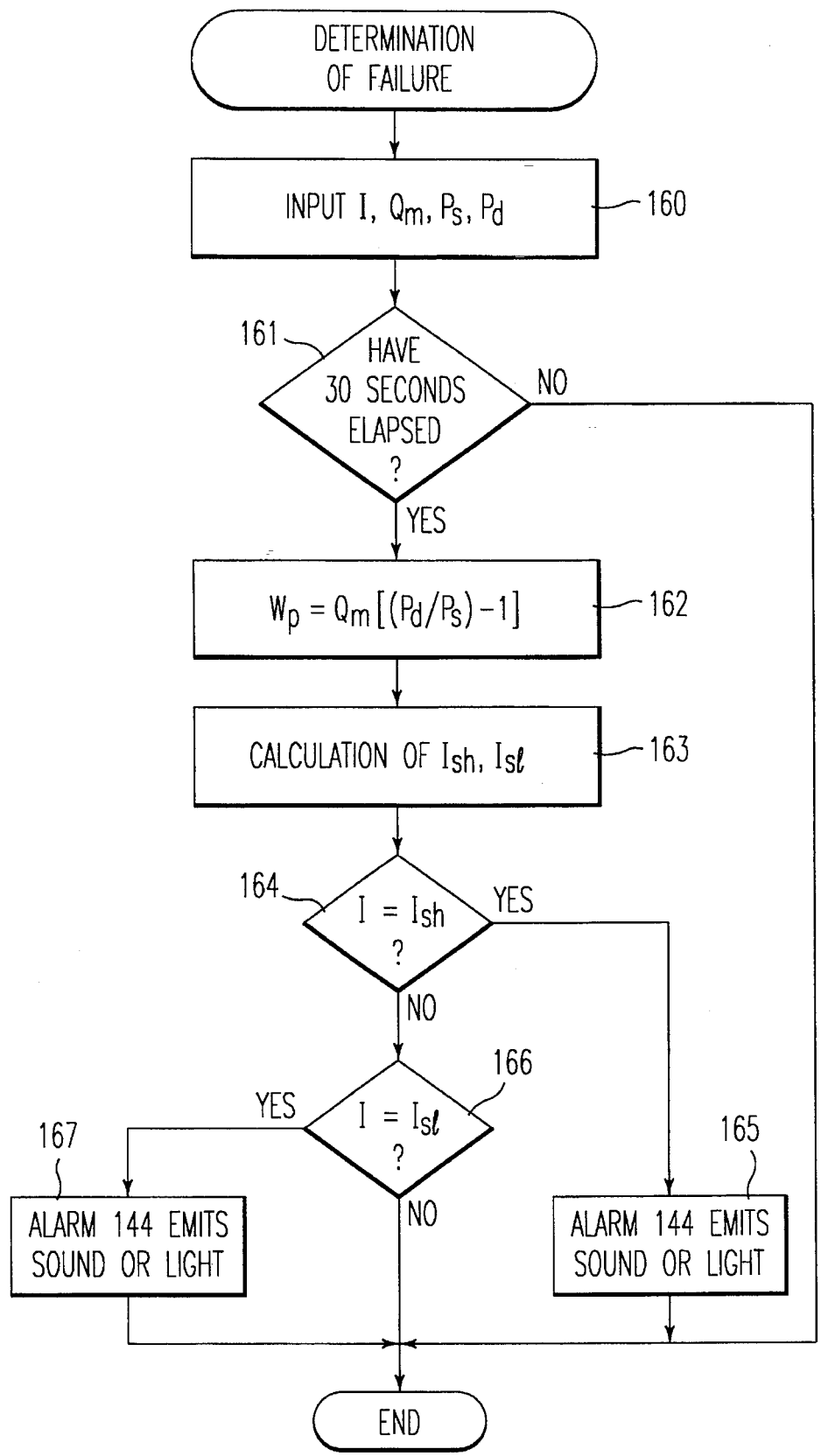
FIG. 9 is a flow chart for determining whether or not a failure in the motor compressor system has occurred.

Referring to FIGS. 6, 8 and 9, a second embodiment of the present invention is described.

Referring to FIG. 8, a roots-type air compressor 100 is connected to a filter 102 via a suction pipe 101 and to a tank 104 via a discharge pipe 103. A motor 105 for driving the compressor 100 is a three-phase induction motor.

The electronic control unit 120 is constructed as a digital computer and comprises a ROM (read only memory) 122, a RAM (random access memory) 123, a CPU (micro-processor) 124, an input port 125, and an output port 126. The ROM 122, the RAM 123, the CPU 124, the input port 125, and the output port 126 are interconnected via a bidirectional bus 121.

A current transformer 140 for detecting a current I input to the motor 105 is attached to one of lead wires of the motor 105, and the current transformer 140 is connected to the input port 125 via an A/D converter 127. A low pressure sensor 141 for detecting a suction pressure of the compressor 100 is arranged at the suction pipe 101, and the low pressure sensor 141 is connected to the input port 125 via an A/D converter 128. A hot wire type mass flow sensor 142 for detecting mass flow Qm of compressible fluid sucked into the compressor 100 is arranged at the suction pipe 101 close to the compressor 100, and the mass flow sensor 142 is connected to the input port 125 via an A/D converter 129. A high pressure sensor 143 for detecting a discharge pressure of the compressor 100 is arranged at the discharge pipe 103, and the high pressure sensor 143 is connected to the input port 125 via an A/D converter 130.

The output port 126 is connected to an alarm 144 via a drive circuit 131.

FIG. 9 illustrates a routine for determining whether or not a failure in the motor compressor system has occurred. This routine is processed by sequential interruptions executed at predetermined intervals.

Referring to FIG. 9, at step 160, the current I input to the motor 105 detected by the current transformer 140, the mass flow Qm detected by the mass flow sensor 142, the suction pressure Ps detected by the low pressure sensor 141, and the discharge pressure Pd detected by the high pressure sensor 143 are input to the CPU 124. At step 161, it is determined whether or not a predetermined time, for example, 30 seconds, has elapsed from the time when power supply to the motor 105 was started. When it is determined that the predetermined time has not elapsed, the processing cycle is completed. Since starting current input to the motor 105 is very large, when the starting current is detected and the failure determination is executed on the basis of the detected starting current, it is erroneously determined that a failure has occurred.

Therefore, the failure determination is not executed until the predetermined time has elapsed from the time when the power supply to the motor 105 was started and thus erroneous determination can be prevented.

At step 162, compression work Wp of the roots compressor is calculated on the basis of the following equation.

$$Wp = Qm[(Pd/Ps) - 1] \qquad (2)$$

In this equation, Qm is mass flow and Pd/Ps is compression ratio.

At step 163, an upper limit reference current Ish and lower limit reference current Isl are calculated from a graph shown in FIG. 6, on the basis of the calculated compression work Wp. The relationship shown in FIG. 6 is as described above. The relationship between the compression work Wp and the upper and lower limit reference currents Ish, Isl shown in FIG. 6 is memorized in ROM 122 as a map.

At step 164, it is determined whether or not the current I is larger than the upper limit reference current Ish. When it is determined that the current I is larger than the upper limit reference current Ish, that is, it is determined that a failure in the motor compressor system has occurred, the routine goes to step 165 and the alarm 144 is controlled to emit sound or light. When the current I is smaller than or equal to the upper limit reference current Ish, the routine goes to step 166 and it is determined whether or not the current I is smaller than lower limit reference current Isl. When it is determined that the current I is smaller than the lower limit reference current Isl, that is, it is determined that a failure in the motor compressor system has occurred, the routine goes to step 167 and the alarm 144 is controlled to emit sound or light. When the current I is larger than or equal to the lower limit reference current Isl, the processing cycle is completed.

As described above, according to the second embodiment of the present invention, since the upper and lower limit reference currents are increased in accordance with an increase of mass flow or an increase of compressive ratio, i.e., an increase of compressive work, it can be determined accurately whether or not a failure in the motor compressor system has occurred over a wide operation range of the roots compressor even though the load of the compressor changes very much.

In the embodiments described above, although the present invention is applied to a reciprocated compressor or a roots compressor, since generally compression work is increased in accordance with an increase of mass flow or an increase of compression ratio, the present invention can be applied to other types of compressors. For example, in an axial flow compressor, compression work is shown by the following equation.

$$Wp=D*Q*H$$

Where H is a head of fluid and corresponds to compressive ratio in the equations (1), (2). Accordingly, the present invention can be applied to an axial flow compressor.

Further, in the embodiments described above, although the present invention is applied to a compressor driven by an induction motor, the present invention can be applied to a compressor driven by other types of motors, for example, a synchronous motor or a direct-current motor.

Furthermore, in the embodiments described above, although the present invention is applied to a refrigeration circuit or air compressor, the present invention can be applied to other units having motor compressor.

Furthermore, in the embodiments described above, although the density detecting sensor 60, the orifice meter 61, and the mass flow sensor 142 are arranged at the suction pipe 4, 101 to detect mass flow, these can be arranged at the discharge pipe 2, 103 to detect indirectly mass flow of compressible fluid sucked into the compressor.

Although the invention has been described with reference to specific embodiments chosen for purposes of illustration, it should be apparent that numerous modifications can be made thereto without departing from the basic concept and scope of the invention.

What is claimed is:

1. A failure determining apparatus for a motor driven compressor system having a compressor and a motor for driving the compressor, comprising:

mass flow detecting means adapted to be coupled to said compressor for sensing fluid mass flow related to said compressor;

compression ratio detecting means adapted to be coupled to said compressor for detecting a compression ratio of said compressor;

reference value generating means coupled to at least one of said mass flow detecting means and said compression ratio detecting means, said reference value generating means generating at least one of variable upper and lower current reference values in response to an output of said at least one of mass flow detecting means and compression ratio detecting means, whereby said variable upper and lower current reference values are responsive to variable operating conditions of said compressor; and failure determining means coupled to said reference value generating means and adapted to be coupled to said motor for detecting motor current value above or below said variable upper or lower current reference value, whereby a failure in the compressor system is detected.

2. A failure determining apparatus according to claim 1, wherein said reference value generating means generates said at least one of variable upper and lower current reference values in such a manner that said upper and lower current reference values are increased in accordance with an increase of an output of said at least one of mass flow detecting means and compression ration detecting means.

3. A failure determining apparatus according to claim 1, wherein said reference value generating means generates said at least one of variable upper and lower current reference values in such a manner that a first ratio r1 and a second ratio r2 are constant, said first and second ratio r1 and r2 being represented by the following equations respectively r1=(Ish–Is)/Is r2=(Is–Isl)/Is wherein Ish: upper current reference value Isl: lower current reference value Is: standard motor current value wherein the motor compressor system is in a normal condition.

4. A failure determining apparatus according to claim 1, wherein said reference value generating means generates said variable upper and lower current reference values in such a manner that a first ratio r1 is equal to said second ratio r2, said first and second ratio r1 and r2 being represented by the following equations respectively r1=(Ish–Is)/Is r2=(Is–Isl)/Is wherein Ish: upper current reference value Isl: lower current reference value Is: standard motor current value wherein the motor compressor system is in a normal condition.

5. A failure determining apparatus according to claim 1, wherein said failure determining means determines that a failure in the motor compressor system has occurred when said motor current value is larger than said upper current reference value or smaller than said lower current reference value.

6. A failure determining apparatus according to claim 1, further comprising failure detection prohibiting means coupled to said failure determining means for prohibiting the detection of said failure determining means until a predetermined time has elapsed from a time when a power supply to the motor was started.

7. A failure determining apparatus according to claim 1, further comprising an alarm coupled to said failure determining means for alarming when said failure determining means detects motor current value above or below said variable upper or lower current reference values, and alarm prohibiting means coupled to said alarm for prohibiting said alarm to generate an alarm even though said failure determining means detects motor current value above or below said variable upper or lower current reference value until a predetermined time has elapsed from a time when a power supply to the motor was started.

8. A failure determining apparatus according to claim 1, wherein said mass flow detecting means and said compression ratio detecting means are coupled to said compressor, and said failure determining means is coupled to said motor.

9. A failure determining apparatus for a motor driven compressor system having a compressor and a motor for driving the compressor, comprising:

a mass flow detector adapted to be coupled to said compressor and sensing fluid mass flow related to said compressor;

a compression ratio detector adapted to be coupled to said compressor and detecting a compression ratio of said compressor;

a reference value generator coupled to at least one of said mass flow detector and said compression ratio detector, said reference value generator generating at least one of variable upper and lower current reference values in response to an output of said at least one of mass flow detector and compression ratio detector, whereby said variable upper and lower current reference values are responsive to variable operating conditions of said compressor; and a failure detector coupled to said reference value generator and adapted to be coupled to said motor, said failure detector detecting motor current value above or below said variable upper or lower current reference value, whereby a failure in the compressor system is detected.

10. A failure determining apparatus according to claim 9, wherein said reference value generator generates said at least one of variable upper and lower current reference values in such a manner that said upper and lower current reference values are increased in accordance with an increase of an output of said at least one of mass flow detector and compression ratio detector.

11. A failure determining apparatus according to claim 9, wherein said reference value generator generates said at least one of variable upper and lower current reference values in such a manner that a first ratio r1 and a second ratio r2 are constant, said first and second ratio r1 and r2 being represented by the following equations respectively r1=(Ish−Is)/Is r2=(Is−Isl)/Is wherein Ish: upper current reference value Isl: lower current reference value Is: standard motor current value wherein the motor compressor system is in a normal condition.

12. A failure determining apparatus according to claim 9, wherein said reference value generator generates said variable upper and lower current reference values in such a manner that a first ratio r1 is equal to said second ratio r2, said first and second ratio r1 and r2 being represented by the following equations respectively r1=(Ish−Is)/Is r2=(Is−Isl)/Is wherein Ish: upper current reference value Isl: lower current reference value Is: standard motor current value wherein the motor compressor system is in a normal condition.

13. A failure determining apparatus according to claim 9, wherein said failure detector determines that a failure in the motor compressor system has occurred when said motor current value is larger than said upper current reference value or smaller than said lower current reference value.

14. A failure determining apparatus according to claim 9, further comprising a failure detection prohibiting unit coupled to said failure detector and prohibiting the detection of said failure detector until a predetermined time has elapsed from a time when a power supply to the motor was started.

15. A failure determining apparatus according to claim 9, further comprising an alarm coupled to said failure detector and alarming when said failure detector detects motor current value above or below said variable upper or lower current reference values, and an alarm prohibiting unit coupled to said alarm and prohibiting said alarm to generate an alarm even though said failure detector detects motor current value above or below said variable upper or lower current reference value until a predetermined time has elapsed from a time when a power supply to the motor was started.

16. A failure determining apparatus according to claim 9, wherein said mass flow detector and said compression ratio detector are coupled to said compressor, and said failure detector is coupled to said motor.

17. A method for determining a failure in a motor driven compressor system having a compressor and a motor for driving the compressor, comprising the steps of:

sensing fluid mass flow related to said compressor;

detecting a compression ratio of said compressor;

generating at least one of variable upper or lower current reference values in response to said at least one of mass flow and compression ratio, whereby said variable upper and lower current reference values are responsive to variable operating conditions of said compressor; and detecting motor current value above or below said variable upper or lower current reference value, whereby a failure in the compressor system is detected.

* * * * *